(12) United States Patent
Erbetta et al.

(10) Patent No.: US 8,680,499 B2
(45) Date of Patent: Mar. 25, 2014

(54) MEMORY CELLS

(75) Inventors: Davide Erbetta, Trezzo Sull'Adda (IT); Luca Fumagalli, Milan (IT); Innocenzo Tortorelli, Moncalieri (IT); Enrico Varesi, Milan (IT)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 13/355,904

(22) Filed: Jan. 23, 2012

(65) Prior Publication Data

US 2013/0187111 A1 Jul. 25, 2013

(51) Int. Cl.
*H01L 29/02* (2006.01)
(52) U.S. Cl.
USPC ..... 257/2; 257/3; 257/4; 257/5; 257/E21.068; 257/E45.002
(58) Field of Classification Search
USPC ............... 257/2, 3, 4, 5, E21.068, E45.002
See application file for complete search history.

(56) References Cited

U.S. PATENT DOCUMENTS

| 5,166,758 | A | 11/1992 | Ovshinsky et al. |
| 7,876,597 | B2 | 1/2011 | Liu |
| 7,903,457 | B2 | 3/2011 | Lung |
| 8,059,449 | B2 | 11/2011 | Shih et al. |
| 2006/0073652 | A1 | 4/2006 | Pellizzer et al. |
| 2007/0238225 | A1 | 10/2007 | Wicker |
| 2009/0008621 | A1* | 1/2009 | Lin et al. ............. 257/3 |
| 2010/0108977 | A1 | 5/2010 | Yoon et al. |
| 2010/0165719 | A1 | 7/2010 | Pellizzer |
| 2010/0293317 | A1 | 11/2010 | Confalonieri et al. |
| 2011/0180905 | A1 | 7/2011 | Zheng et al. |
| 2012/0326111 | A1* | 12/2012 | Cheng et al. ............. 257/2 |

OTHER PUBLICATIONS

U.S. Appl. No. 13/070,169, filed Mar. 23, 2011 by Camillo Bresolin et al.

* cited by examiner

*Primary Examiner* — Andy Huynh
(74) *Attorney, Agent, or Firm* — Wells St. John P.S.

(57) ABSTRACT

Some embodiments include memory cells which contain chalcogenide material having germanium in combination with one or both of antimony and tellurium. An atomic percentage of the germanium within the chalcogenide material is greater than 50%; and may be, for example, within a range of from greater than or equal to about 52% to less than or equal to about 78%. In some embodiments, the memory cell has a top electrode over the chalcogenide material, a heater element under and directly against the chalcogenide material, and a bottom electrode beneath the heater element. The heater element may be L-shaped, with the L-shape having a vertical pillar region joining with a horizontal leg region. A bottom surface of the horizontal leg region may be directly against the bottom electrode, and a top surface of the vertical pillar region may be directly against the chalcogenide material.

5 Claims, 6 Drawing Sheets

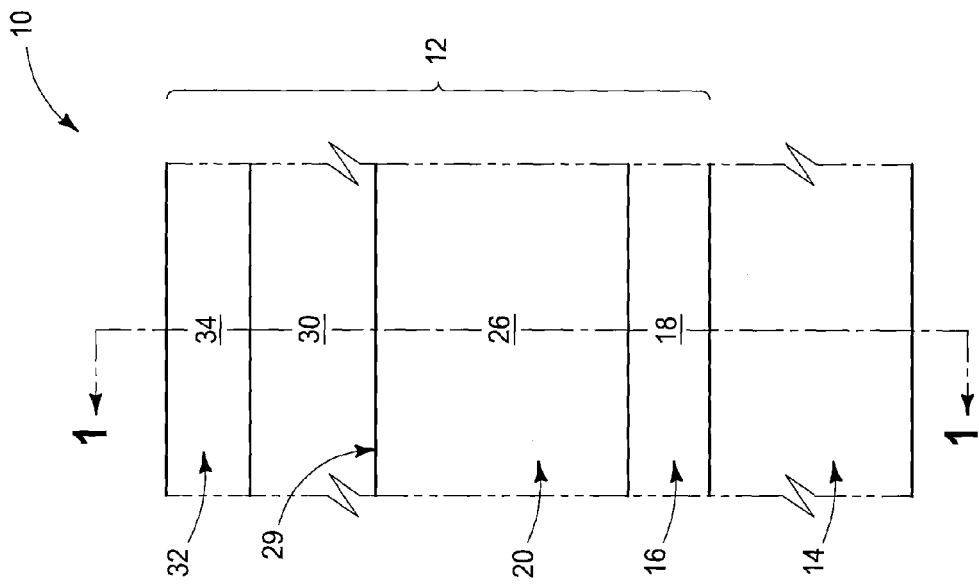
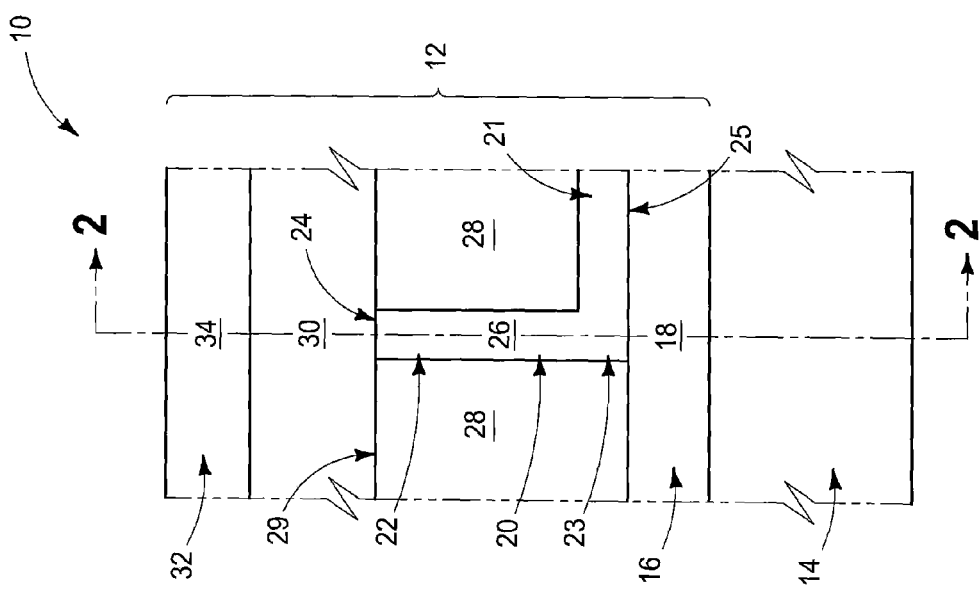

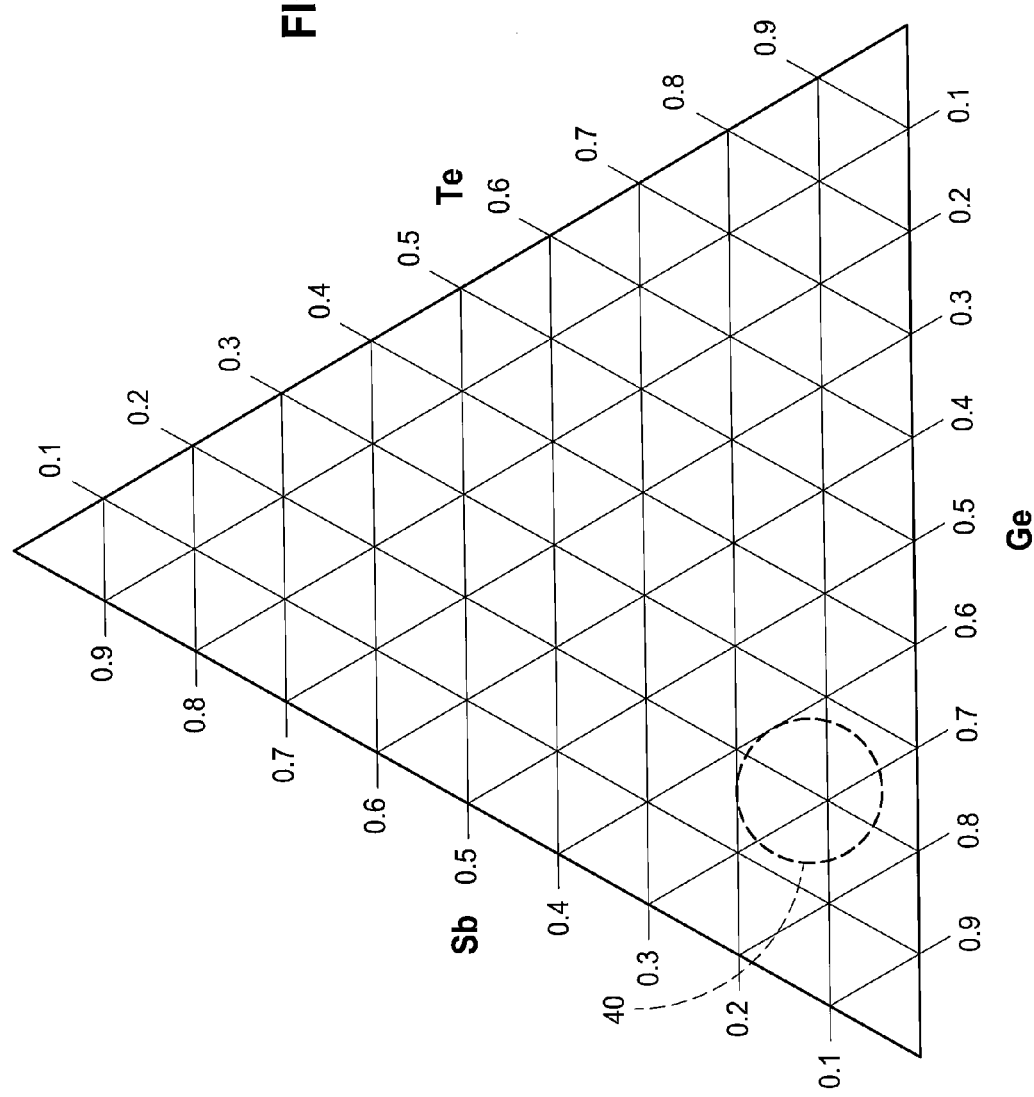

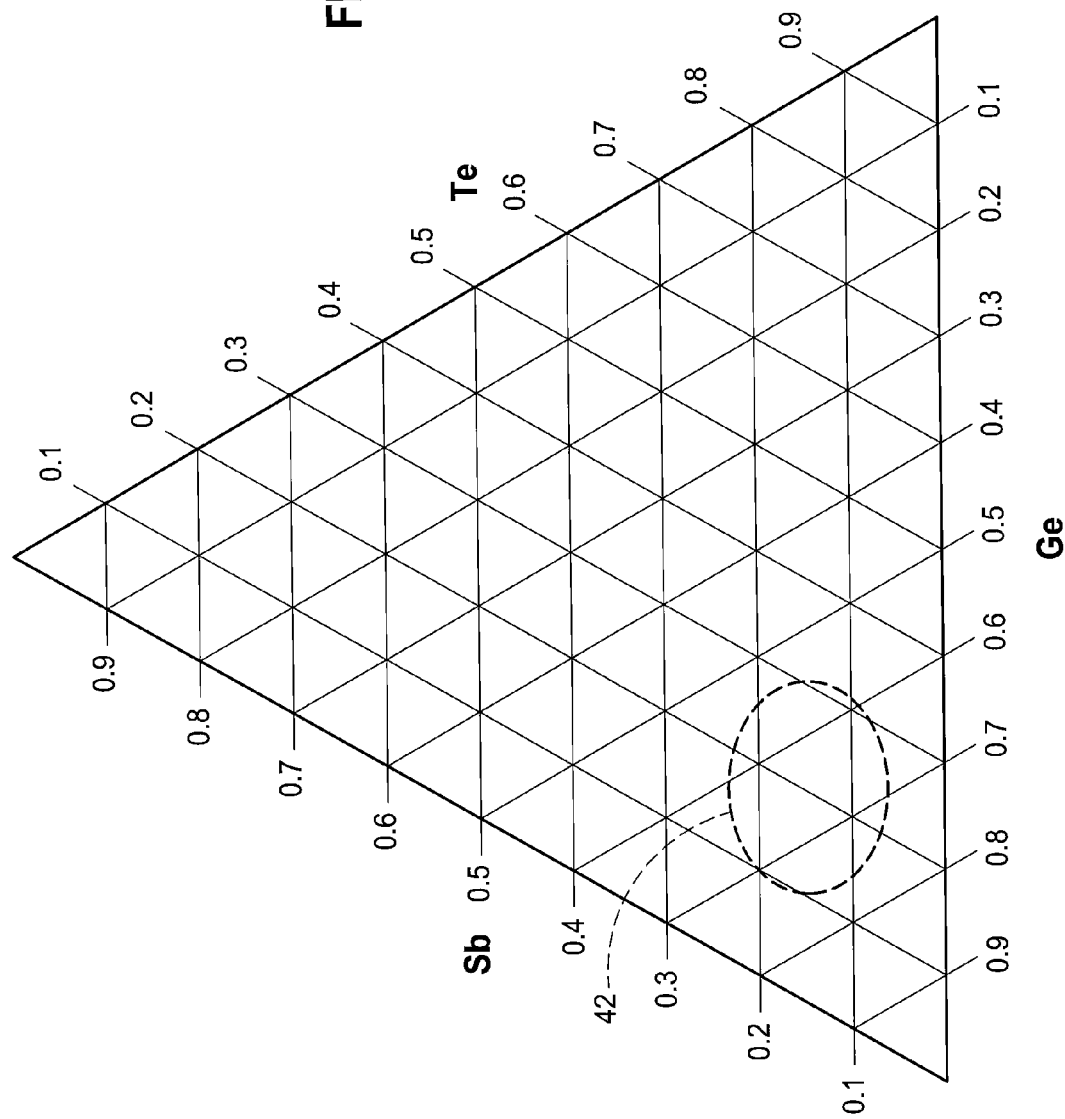

MEMORY CELLS

TECHNICAL FIELD

Memory cells.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

It is desired to achieve efficient programming of memory cells (for example, programming which is rapid, and which does not waste energy), stable data retention by the memory cells, and rapid read properties of the cells. Accordingly, it would be desired to develop new chalcogenide materials which could improve one or more of such properties of PCM cells, and to develop memory cell architectures utilizing such new chalcogenide materials.

BRIEF DESCRIPTION OF THE DRAWINGS

FIGS. 1 and 2 are diagrammatic cross-sectional views of an example embodiment memory cell. The view of FIG. 2 is along the line 2-2 of FIG. 1; and the view of FIG. 1 is along the line 1-1 of FIG. 2.

FIG. 3 graphically illustrates data retention characteristics of example embodiment memory cells comprising various chalcogenide compositions.

FIG. 4 graphically illustrates programming current characteristics for example embodiment memory cells comprising various chalcogenide compositions.

DETAILED DESCRIPTION OF THE ILLUSTRATED EMBODIMENTS

Figure 5:
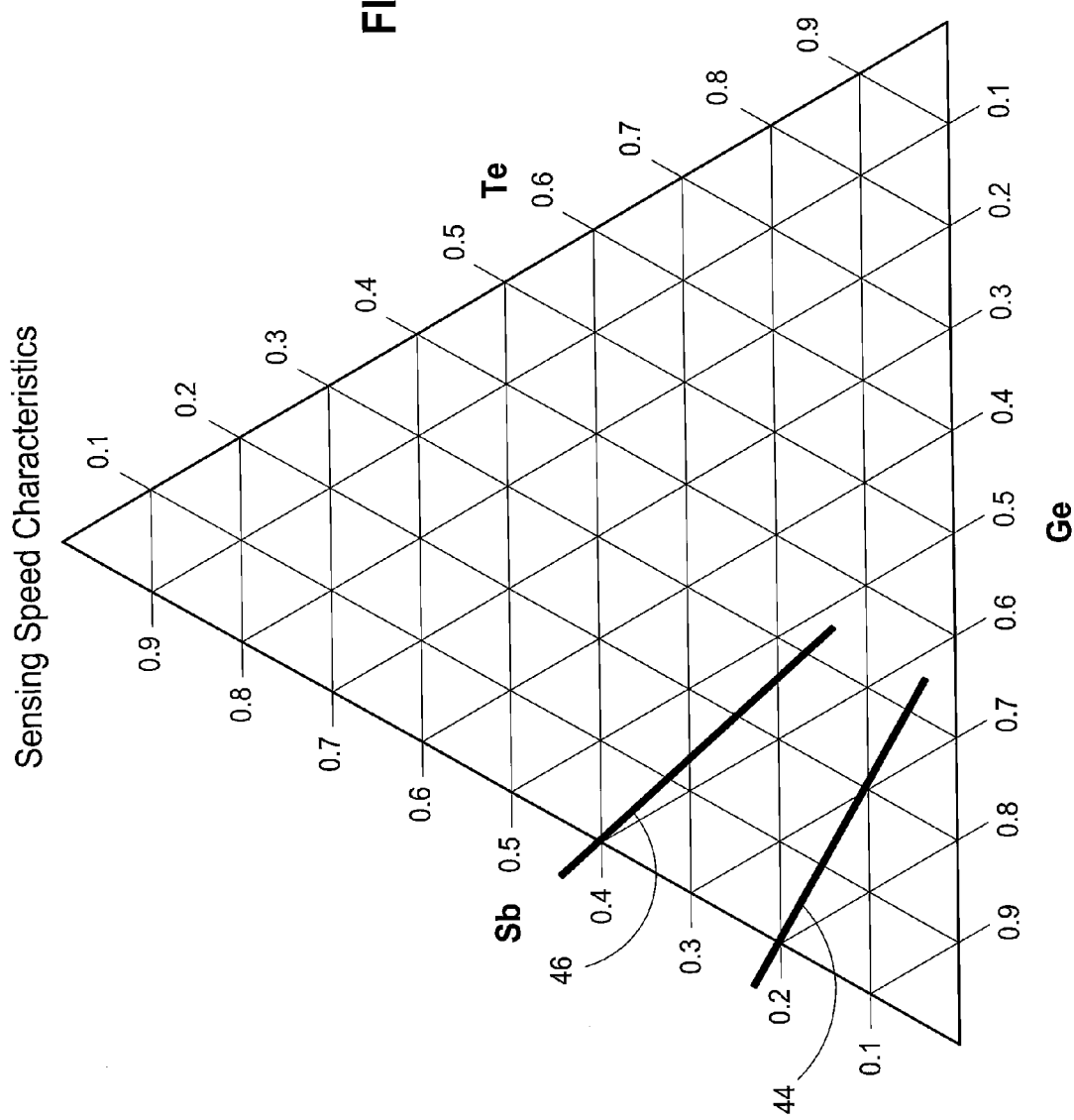
FIG. 5 graphically illustrates sensing speed characteristics for example embodiment memory cells comprising various chalcogenide compositions.

In some embodiments, the invention includes identification of chalcogenide compositions having exceptional properties for incorporation into PCM, and includes memory cells comprising such chalcogenide compositions.

An example embodiment memory cell 12 is described with reference to FIGS. 1 and 2 as part of a construction 10.

The memory cell 12 is supported by a base 14. The base 14 may comprise, consist essentially of or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 14 is shown to be homogenous, the base may comprise numerous materials in some embodiments. For instance, base 14 may correspond to a semiconductor substrate containing one or more materials associated with integrated circuit fabrication. In such embodiments, such materials may correspond to one or more of refractory metal materials, barrier materials, diffusion materials, insulator materials, etc.

The memory cell 12 comprises a first electrode 16 over the base. The first electrode comprises an electrically conductive material 18. Such electrically conductive material may comprise any suitable composition or combination of compositions; and in some embodiments may comprise, consist essentially of, or consist of tungsten.

A heater element 20 is over the first electrode. In the shown embodiment, the heater element is configured as an angled plate having a first portion 21 extending along a first direction, and a second portion 22 extending along a second direction. The first and second portions join to one another at a corner 23. The illustrated heater element 20 has the second portion 22 of the angled plate extending substantially orthogonally relative to the first portion 21 (i.e., the corner 23 is substantially a right angle). In other embodiments, the second portion may be at a different angle relative to the first portion.

In some embodiments, the illustrated heater element 20 may be considered to be "L-shaped." The L-shape has a vertical pillar region corresponding to portion 22 and a horizontal leg region corresponding to portion 21.

In some embodiments, the illustrated heater element may be considered to have an upper region corresponding to an upper edge 24 along portion 22, and a bottom region corresponding to a bottom surface 25 along portion 21. In the shown embodiment, the upper region is relatively narrow as compared to the bottom region.

The heater element 20 comprises a material 26. Such material may be of any suitable composition or combination of compositions; and in some embodiments may comprise TiN, doped TiN, etc.

In the shown embodiment, an electrically insulative material 28 is provided along sides of the heater element (as shown in FIG. 1). The electrically insulative material may comprise any suitable composition or combination of compositions; and in some embodiments may comprise, consist essentially of, or consist of one or both of silicon dioxide and silicon nitride. A planarized upper surface 29 is formed across the heater element 20 and the electrically insulative material 28.

Chalcogenide material 30 is over the planarized surface 29. The chalcogenide material comprises a composition containing germanium in combination with one or both of antimony and tellurium; with the germanium being present to at least 50 atomic percent (atomic %). Suitable chalcogenide material compositions are described below with reference to FIGS. 3-7.

A second electrode 32 is over chalcogenide material 30. The second electrode comprises an electrically conductive material 34. Such electrically conductive material may comprise any suitable composition or combination of compositions; and in some embodiments may comprise, consist essentially of or consist of tungsten. The material 34 of the second electrode 32 may be the same or different relative to the material 18 of the electrode 16.

In the shown embodiment, the chalcogenide material 30 is directly against the upper surface 24 of heater element 20, and the bottom surface 25 of the heater element is directly against the first electrode 18.

In operation, programming of the memory cell 12 is accomplished by generating an electric field between electrodes 16 and 32. Such electric field causes the heater element to heat a programmable region of chalcogenide material 30, which thereby induces a phase change within such region of the chalcogenide material. Reading of the memory cell may be accomplished by providing an electric field between electrodes 16 and 32 which is too small to induce a programming phase change within the memory cell, but which enables resistivity through the memory cell to be ascertained. Such resistivity can be utilized to determine a phase within the programmable region of the chalcogenide, and to thereby ascertain a memory state of the chalcogenide.

The memory cell of FIGS. 1 and 2 may be representative of a large number of memory cells that are together incorporated into a memory array. Each of the electrodes 16 and 32 may be electrically coupled with an access/sense line (for instance, a wordline or bitline), and each memory cell of the array may be uniquely addressed through a combination comprising a pair of the access/sense lines.

Chalcogenide materials having particular stoichiometries described below with reference to FIGS. 3-7 may be exceptionally suitable for utilization in PCM cells of the type shown in FIGS. 1 and 2. Specifically, the narrow upper surface of the heater element can focus heating into a small programmable region of the chalcogenide material, which can lead to rapid programming of a memory cell as compared to memory cells having different configurations of heater elements. The rapid programming may be enhanced through utilization of chalcogenide compositions described below with reference to FIGS. 3-7. However, although the chalcogenide materials described below may be exceptionally suitable for utilization in PCM cells of the type shown in FIGS. 1 and 2, the chalcogenide materials may also be utilized in other memory cells; and may provide advantages in such memory cells as compared to conventional chalcogenide materials.

FIG. 3 graphically summarizes data retention characteristics of memory cells utilizing chalcogenide materials consisting of germanium, antimony and tellurium at various stoichiometries. The chalcogenide materials were baked at 250° C. for about 1 hour prior to measuring data retention characteristics of such materials. A dashed line boundary 40 is provided on the graph of FIG. 3, and the behavior of numerous different stoichiometric combinations of germanium, antimony and tellurium indicates that good data retention characteristics are achieved by compositions within a region contained by the boundary 40. Such region comprises stoichiometries having germanium present to from about 60 atomic % to about 76 atomic %; tellurium present to from about 12 atomic % to about 28 atomic %; and antimony present to from about 5 atomic % to about 20 atomic %.

FIG. 4 graphically summarizes programming current characteristics of memory cells utilizing chalcogenide materials consisting of germanium, antimony and tellurium at various stoichiometries. A dashed line boundary 42 is provided on the graph of FIG. 4, and the behavior of numerous different stoichiometric combinations of germanium, antimony and tellurium indicates that good programming current characteristics are achieved by compositions within a region contained by the boundary 42. Such region comprises stoichiometries having germanium present to from about 54 atomic % to about 76 atomic %; tellurium present to from about 9 atomic % to about 32 atomic %; and antimony present to from about 5 atomic % to about 23 atomic %.

FIG. 5 graphically summarizes sensing speed characteristics of memory cells utilizing chalcogenide materials consisting of germanium, antimony and tellurium at various stoichiometries. Lines 44 and 46 are provided on the graph of FIG. 5, and the behavior of numerous different stoichiometric combinations of germanium, antimony and tellurium indicates that good sensing speed characteristics are achieved by compositions within a region contained between the lines 44 and 46 (there may be some advantage to being closer to line 46 than 44 in order to have desired low resistance). The region between lines 44 and 46 comprises stoichiometries having germanium present at greater than 50 atomic %.

Figure 6:
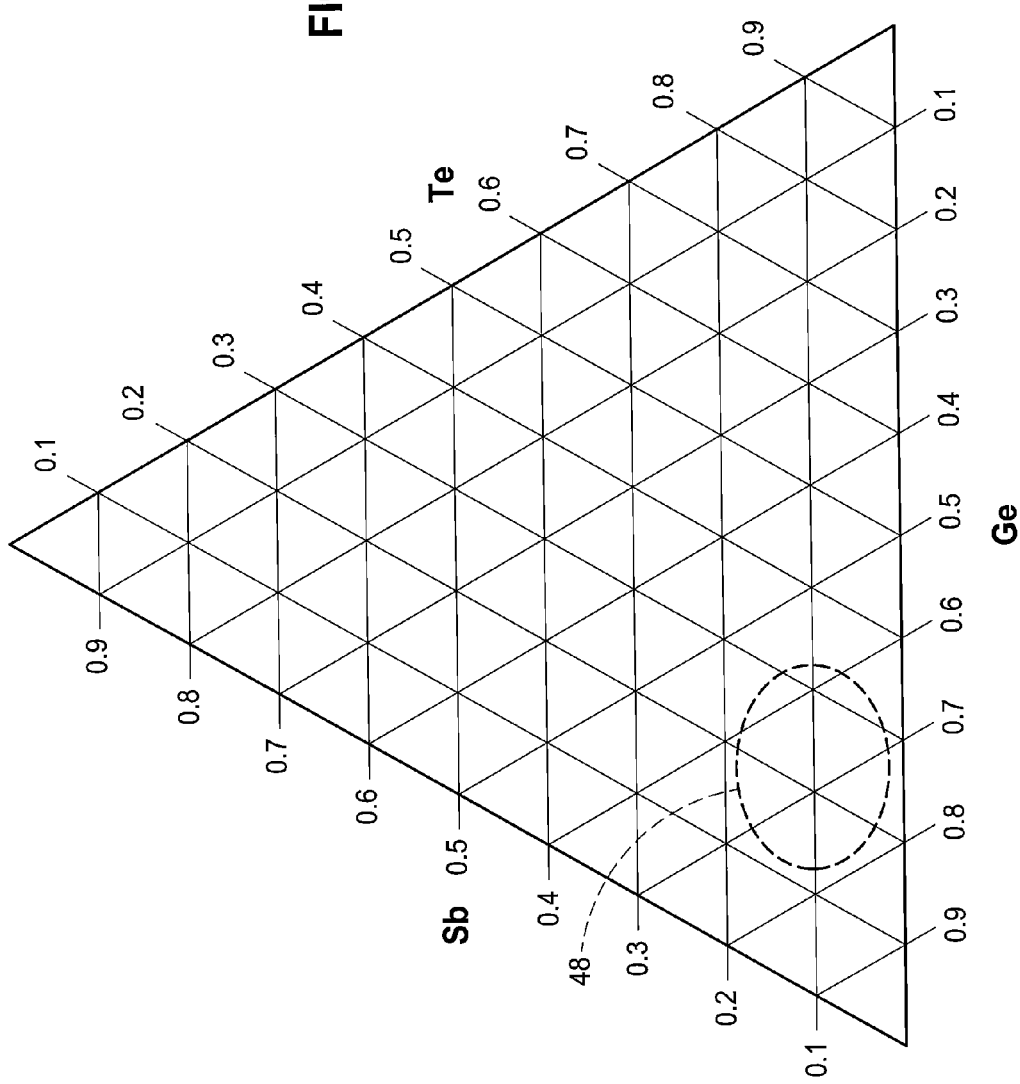
FIG. 6 graphically illustrates read voltage characteristics for example embodiment memory cells comprising various chalcogenide compositions.

FIG. 6 graphically summarizes read voltage characteristics of memory cells utilizing chalcogenide materials consisting of germanium, antimony and tellurium at various stoichiometries. A dashed line boundary 48 is provided on the graph of FIG. 6, and the behavior of numerous different stoichiometric combinations of germanium, antimony and tellurium indicates that good read voltage characteristics are achieved by compositions within a region contained by the boundary 48. Such region comprises stoichiometries having germanium present to from about 56 atomic % to about 79 atomic %; tellurium present to from about 11 atomic % to about 34 atomic %; and antimony present to from about 1 atomic % to about 19 atomic %.

Figure 7:
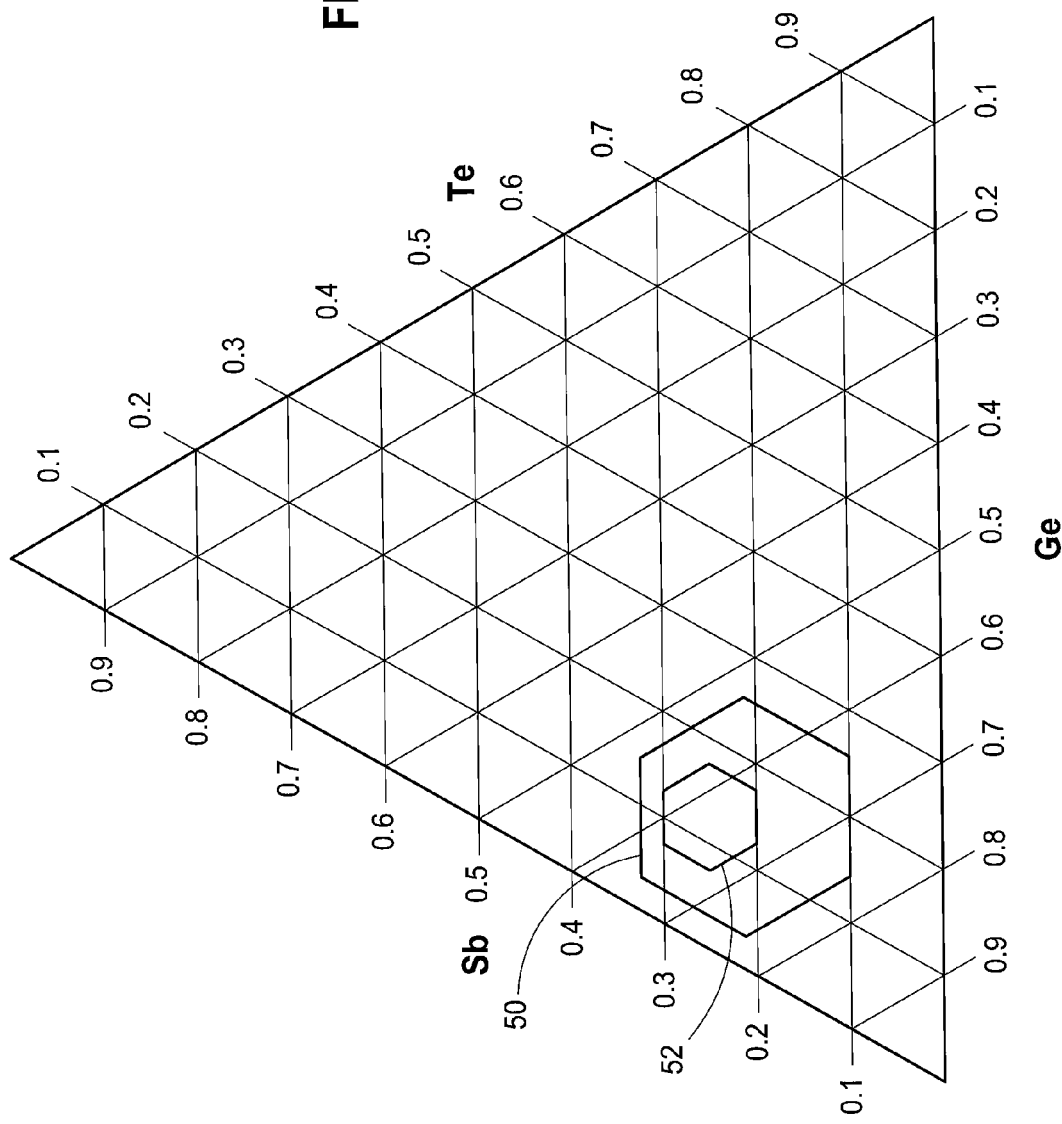
FIG. 7 graphically illustrates stoichiometric relationships of germanium, tellurium and antimony for various chalcogenide compositions; with bounded regions being provided to characterize compositions having exceptional properties for utilization in memory cells.

FIG. 7 graphically summarizes the behavioral characteristics of memory cells utilizing chalcogenide materials consisting of germanium, antimony and tellurium at various stoichiometries. A first polygon 50 is provided on the graph of FIG. 7, and a second polygon 52 is provided within the first polygon. The behavior of numerous different stoichiometric combinations of germanium, antimony and tellurium indicates that exceptional combinations of memory cell characteristics are achieved by compositions within the region contained by polygon 50, and even better combinations of characteristics may be achieved by compositions within the region contained by polygon 52.

In some embodiments, compositions within one or both of the regions 50 and 52 of FIG. 7 may be considered as compositions consisting of germanium, tellurium and antimony; and having germanium present to greater than 50 atomic %; and in some cases greater than about 56 atomic %. In some example embodiments, the chalcogenide compositions may have germanium present within a range of from greater than or equal to about 52 atomic % to less than or equal to about 80 atomic % (in some cases, less than or equal to about 78%); tellurium present to within a range of from greater than or equal to about 2 atomic % to less than or equal to about 28 atomic % (in some cases, within a range of from about 5 atomic % to less than or equal to about 18 atomic %); and antimony present to within a range of from greater than or equal to about 10 atomic % to less than or equal to about 34 atomic % (in some cases, within a range of from greater than or equal to about 20 atomic % to less than or equal to about 30 atomic %). In some embodiments, the germanium may be present to within a range of from greater than or equal to about 58 atomic % to less than or equal to about 70 atomic % (and in some cases, less than or equal to about 68 atomic %).

Alternatively, compositions within one or both of the regions 50 and 52 of FIG. 7 may be considered as compositions consisting of $Ge_{(52+x)}Sb_{(10+y)}Te_{(38-(x+y))}$; where x is greater than 0 and less than or equal to about 26, where y is greater than 0 and less than or equal to about 20, and where $(38-(x+y))$ is greater than 0. In some embodiments, a phase change memory cell may comprise chalcogenide consisting of $Ge_{(56+x)}Sb_{(6+y)}Te_{(38-(x+y))}$; where x is greater than 0 and less than or equal to about 22, where y is greater than 0 and less than or equal to about 24, and where $(38-(x+y))$ is greater than 0.

As another example, compositions within one or both of the regions 50 and 52 of FIG. 7 may be considered as compositions consisting of $Ge_{(52+p)}Sb_{(46-(p+q))}Te_{(2+q)}$; where p is greater than 0 and less than or equal to about 26, where q is greater than 0 and less than or equal to about 26, and where $(46-(p+q))$ is greater than 0. In some embodiments, a phase change memory cell may comprise chalcogenide consisting of $Ge_{(56+p)}Sb_{(46-(p+q))}Te_{(2+q)}$; where p is greater than 0 and less than or equal to about 22, where q is greater than 0 and less than or equal to about 26, and where $(42-(p+q))$ is greater than 0.

A couple of specific example chalcogenide stoichiometries that may have exceptional characteristics for utilization in memory cells are $Ge_{61}Sb_{22}Te_{17}$ and $Ge_{63}Sb_{25}Te_{12}$. Such example stoichiometries illustrate that in some embodiments a chalcogenide may consist of Ge, Sb and Te; with the Ge present to within a range of from greater than or equal to about 60 atomic % to less than or equal to about 65 atomic %.

Although the chalcogenide stoichiometries within the regions 50 and 52 of FIG. 7 contain germanium in combination with both antimony and tellurium, in some embodiments suitable chalcogenide materials may comprise at least 50 atomic % germanium in combination with only antimony or in combination with only tellurium. Accordingly, some suitable chalcogenide compositions may consist of antimony and germanium, with the germanium being present in the compositions to at least 50 atomic %; and some suitable chalcogenide compositions may consist of tellurium and germanium, with the germanium being present in the compositions to at least 50 atomic %.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc. In some embodiments, memory cells having chalcogenide compositions described herein may have retention characteristics suitable for utilization in automotive fields, or other fields, in which the compositions may be exposed to relatively high temperatures. For instance, in automotive fields it may be desired to have memory cells suitable for storage at a temperature of at least about 100° C. for at least about 10 years (for instance, circuits near the engine of an automobile may experience temperatures exceeding 100° C. for long periods). As another example, it can be desired to have thermally resistant circuitry near locations where soldering will occur, in that the soldering may expose the circuitry to peak temperatures of at least about 260° C.

Chalcogenide compositions described herein may have programming current characteristics suitable to enable low thermal conductivity/high self-heating efficiency (high resistivity in high-field conduction) to reduce programming current and avoid thermal disturb problems in high density architectures.

Chalcogenide compositions described herein may have a large threshold voltage in an amorphous state which can enable higher read voltages than are utilized in conventional PCM cells. In some embodiments, chalcogenide compositions described herein may have a read window suitable so that active material has high resistance in an amorphous phase and low resistance in a set state under low field voltage conditions to enable fast sensing operations.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include memory cells comprising chalcogenide material which includes germanium in combination with one or both of antimony and tellurium. An atomic percentage of the germanium within the chalcogenide material is within a range of from greater than or equal to about 52% to less than or equal to about 78%.

Some embodiments include memory cells having a first electrode and a heater element over the first electrode. The heater element is shaped as an angled plate. The angled plate comprises a first portion extending along a first direction, a second portion extending along a second direction, and a corner joining the first and second portions to one another. A bottom surface of the first portion is directly against the first electrode. The memory cells include chalcogenide material over the heater element, and a second electrode over the chalcogenide material. The chalcogenide material is directly against an edge of the second portion of the heater element angled plate. The chalcogenide material comprises germanium in combination with one or more other elements. An atomic percentage of the germanium within the chalcogenide material is greater than about 50%.

Some embodiments include memory cells having a first electrode, a heater element over the first electrode, a chalcogenide material over the heater element, and a second electrode over the chalcogenide material. The heater element comprises a relatively wide region directly against the first electrode, and comprises a relatively narrow region above the relatively wide region. The chalcogenide material is directly against the relatively narrow region of the heater element. The chalcogenide material comprises germanium in combination with one or both of antimony and tellurium. An atomic percentage of the germanium in the chalcogenide material is within a range of from greater than or equal to about 52% to less than or equal to about 80%.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell comprising:
   a chalcogenide material which includes germanium in combination with antimony and tellurium;
   wherein an atomic percentage of the germanium within the chalcogenide material is within a range of from greater than or equal to about 58% to less than or equal to about 68%; and
   wherein an atomic percentage of the tellurium within the chalcogenide material is within a range of from greater than or equal to about 5% to less than or equal to about 18%.

2. The memory cell of claim 1 wherein the chalcogenide material consists of $Ge_{61}Sb_{22}Te_{17}$ or $Ge_{63}Sb_{25}Te_{12}$.

3. The memory cell of claim 2 further comprising a top electrode over the chalcogenide material, a heater element under and directly against the chalcogenide material, and a bottom electrode beneath the heater element; wherein the heater element is L-shaped; the L-shape having a vertical pillar region joining with a horizontal leg region; a bottom surface of the horizontal leg region being directly against the bottom electrode, and a top surface of the vertical pillar region being directly against the chalcogenide material.

4. A memory cell, comprising:
   a first electrode;
   a heater element over the first electrode; the heater element being shaped as an angled plate; the angled plate comprising a first portion extending along a first direction, a second portion extending along a second direction, and a corner joining the first and second portions to one another; a bottom surface of the first portion being directly against the first electrode;
   a chalcogenide material over the heater element, the chalcogenide material being directly against an edge of the second portion of the heater element angled plate; the chalcogenide material comprising germanium in combination with one or more other elements; an atomic percentage of the germanium within the chalcogenide material being greater than about 50%; wherein the chalcogenide material consists of germanium, tellurium and antimony; wherein an atomic percentage of the tellurium within the chalcogenide material is within a range of from greater than or equal to about 5% to less than or equal to about 18%; and
   a second electrode over the chalcogenide material.

5. A memory cell, comprising:
   a first electrode;
   a heater element over the first electrode; the heater element comprising a relatively wide region directly against the first electrode, and comprising a relatively narrow region above the relatively wide region;
   a chalcogenide material over the heater element; the chalcogenide material being directly against the relatively narrow region; the chalcogenide material comprising germanium in combination with antimony and tellurium; an atomic percentage of the germanium in the chalcogenide material being within a range of from greater than or equal to about 52% to less than or equal to about 80%; an atomic percentage of the tellurium within the chalcogenide material being within a range of from greater than or equal to about 5% to less than or equal to about 18%; and
   a second electrode over the chalcogenide material.

* * * * *